United States Patent
Hatano et al.

[11] Patent Number: 5,234,742
[45] Date of Patent: Aug. 10, 1993

[54] PELLICLE FOR LITHOGRAPHY

[75] Inventors: Etsuo Hatano, Yokohama; Yoshihiro Kubota, Takasaki; Akira Yamamoto; Toyohisa Sakurada, both of Joetsu; Masaaki Iguchi, Higashi-Kurume, all of Japan

[73] Assignee: Shin-Etsu Chemical Co., Ltd., Tokyo, Japan

[21] Appl. No.: 902,407

[22] Filed: Jun. 19, 1992

Related U.S. Application Data

[63] Continuation of Ser. No. 826,271, Jan. 24, 1992, abandoned, which is a continuation of Ser. No. 487,607, Mar. 2, 1990, abandoned.

[30] Foreign Application Priority Data

Mar. 3, 1989 [JP] Japan .................................. 1-51290

[51] Int. Cl.$^5$ .................................................. B32B 27/30
[52] U.S. Cl. .................................... 428/192; 428/220; 428/449; 428/457; 526/279; 359/350
[58] Field of Search ................. 526/279; 359/1, 350, 359/507, 894, 902; 428/38, 220, 192

[56] References Cited

U.S. PATENT DOCUMENTS

| | | | |
|---|---|---|---|
| 4,378,953 | 4/1983 | Winn | 350/171 |
| 4,433,044 | 2/1984 | Meyer | 430/271 |
| 4,476,172 | 10/1984 | Ward | 428/38 |
| 4,778,868 | 10/1988 | Higashimura | 526/279 |
| 4,837,386 | 6/1989 | Puri | 204/157.61 |

FOREIGN PATENT DOCUMENTS 6335614 2/1982 Japan .

Primary Examiner—Joseph L. Schofer
Assistant Examiner—Mark Nagumo
Attorney, Agent, or Firm—McAulay Fisher Nissen Goldberg & Kiel

[57] ABSTRACT

A pellicle for lithography based on the exposure method especially adapted for lithographic lights having wave lengths of 500 nm or smaller, characterized in that the pellicle film is made of a high polymer organic silicon compound, preferably of a general molecular formula:

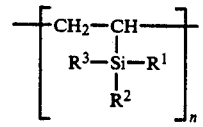

where $R^1$, $R^2$, and $R^3$ are the same or different alkyl groups having one to eight carbon atoms, and n is an integer between 100 and 40,000.

4 Claims, No Drawings

PELLICLE FOR LITHOGRAPHY

This is a continuation of application Ser. No. 07/826,271, filed Jan. 24, 1992, now abandoned, which, in turn, is a continuation of application Ser. No. 07/487,607, filed Mar. 2, 1990 now abandoned.

BACKGROUND OF THE INVENTION

1. Field of the Invention

The present invention relates to a pellicle for lithography comprising a film used as a dust-preventing cover for a photomask or a reticle. More particularly it relates to a pellicle that is used in lithography adapted for manufacture of semiconductor devices, such as, LSI and VLSI based on the exposure method wherein a light having a wave length of 500 nm or shorter is generally employed.

In the manufacture of LSI and VLSI semiconductor devices, light is emitted through a mask to a semiconductor wafer to thereby effect patterning on the surface of the wafer. But if the mask is not free of dust, some of the light is absorbed or bent by the dust so that the transferred pattern is deformed or has a rough edge, or the white portion of the transferred pattern is darkened, whereby the dimension quality, and appearance of the pattern are adversely affected.

Therefore, operations of this kind are generally conducted in a clean room; but even so it is not easy to keep the mask free of dust throughout the operation. Hence it has been the usual practice to have the surface of the mask covered with a pellicle which can transmit nearly 100% of the light for lithographical patterning. The pellicle comprises a thin film often made of cellulose nitrate, cellulose acetate, etc. pasted on a frame work.

2. Description of the Prior Art

However, the conventional pellicle film made of cellulose nitrate, cellulose acetate, etc., exhibits a large absorption edge in the short wave length region of the spectrum, such as, 210–400 nm. Generally, it is chemically so unstable that it undergoes yellowing when it absorbs light, so that it cannot be used for VLSI lithography wherein the light emitted is Excimer Laser or i-line ultraviolet light which has a wave length in the range of 210 to 400 nm. Thus, need for a pellicle for lithography that can be used for applications wherein the emitted light has a short wave length, such as, 500 nm or shorter has developed.

SUMMARY OF THE INVENTION

This invention was made in view of the foregoing circumstances, and it is an object of the invention to provide a pellicle for lithography which overcomes the aforementioned problems. The pellicle thus invented, and disclosed herein is a dust-preventing film made from a high polymer organic silicon compound and can be used in applications of lithography wherein the emitted light has a wave length of 500 nm or shorter.

The inventors have discovered that, if instead of the conventionally employed cellulose nitrate or cellulose acetate, a high polymer organic silicon compound is used for the pellicle film, the thus made film effectively passes light having wave lengths of 500 nm or shorter. Moreover, when subjected to the light of short wavelengths of 210–400 nm, it does not create an absorption edge. Thus, the inventive pellicle can be effectively used in the lithography wherein the emitted light has a wave length of 500 nm or shorter.

The pellicle for lithography of the present invention comprises a high polymer organic silicon compound film. In particular, the high polymer organic silicon compound can be shaped into a film by means of any known method, such as, the solution caster method wherein the high polymer organic silicon compound is dissolved in a suitable solvent, e.g. benzene and toluene, and the viscous solution is formed into a film by means of the solution caster method using a spin coater or a knife coater. Also, the T-die method or the inflation method wherein the high polymer organic silicon compound is fused and extruded in film form can be used.

DETAILED DESCRIPTION OF THE INVENTION

The high polymer organic silicon compound used in the invention can be a polymer of any known organic silicon compound that can be shaped into a film; but from the viewpoint of high transmittance of light having short wave lengths from 210 to 400 nm and high film strength, a preferred high polymer organic silicon compound is one that has a general molecular formula (1) as follows:

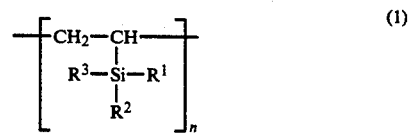

wherein $R^1$, $R^2$, and $R^3$ are the same or different alkyl groups having one to eight carbon atoms, e.g. methyl, ethyl, propyl, butyl, and octyl, and n is an integer between 100 and 40,000. Preferred examples of such high polymer organic silicon compounds include polytrimethylvinylsilane, polytriethylvinylsilane, and polyethyldimethylvinylsilane. If the integer n is smaller than 100, the film strength will be too poor; and manufacture of high polymer organic silicon compounds wherein n is greater than 40,000 is industrially impractical.

The high polymer organic silicon compound film made in the above methods should have a thickness of 0.5 μm or greater so that its mechanical strength, when used in a pellicle, is sufficiently large. However, even in those cases where the film is coated with an antireflection layer for the purpose of transmitting more than 96% of the ultraviolet light whose wave length is 249 nm or greater, the film thickness should not exceed 300 μm. Preferred examples of antireflection layer are described in U.S. Pat. No. 4,796,973 and U.S. Pat. No. 4,861,402.

This high polymer organic silicon compound film has a high ultraviolet light transmittance, and also effectively transmits the lights of short wave length (210–400 nm) so that it is specially useful as a pellicle for lithography wherein the light used has a short wave length. The film is adhesively fixed on a frame made of aluminum or the like to make a pellicle.

The following examples illustrate the invention.

EXAMPLE 1 AND COMPARATIVE EXAMPLE

A polytrimethylvinylsilane whose intrinsic viscosity in its toluene solution at 20° C. is 0.95 dl/g was dissolved in toluene to make a 3% solution. This solution was cast over a smooth glass plate by means of a knife coater of 50 μm clearance, dried at room temperature for 24 hours, and then dried at 60° C. for two hours and at 100° C. for one hour.

Next, the thus made polytrimethylvinylsilane film on the glass plate was adhered to one face of an aluminum ring frame whose inner diameter was 130 mm with an epoxy resin adhesive (Araldite Rapid manufactured by Showa Kobunshi Co., Ltd. of Japan), and the adhesive was allowed to cure for one hour. Thereafter, the film together with the frame and the glass plate was submerged in water. After 5 minutes, the film, which had been naturally released from the glass plate was picked up with the frame. After air-drying the film, the portion of the film extending beyond the external edge of the aluminum frame was cut off. As a result, a uniformly tensed pellicle for lithography comprising the polytrimethylvinylsilane film having a thickness of 1.3 μm was prepared (Example 1).

Next, the light transmittance of this film was examined, and it was found that more than 90% of the light of wave lengths between 240 and 500 nm was transmitted through the film. Also, when both faces of the film were coated with an antireflection layer, 98.4% of 436-nm g-line light, 98.2% of 365-nm i-line light, and 98.1% of 249-nm Excimer Laser were transmitted through the film. No yellowing of the film was observed during the examination. Thus, it was confirmed that the film was an advantageous pellicle film.

By way of comparison, a pellicle for lithography having a thickness of 1.4 μm was made in the same manner as Example 1 except that in place of the toluene solution of polytrimethylvinylsilane, an ethyl acetate solution of nitrocellulose (HIG-20 manufactured by Asahi Chemical Co., Ltd. of Japan) was used. The light transmittance of this film was examined and it was found that as much as 97.9% of 436-nm g-line light and 97.5% of 365-nm i-line light were transmitted through this film. However, only 41.1% of 249-nm Excimer Laser could pass through the film. Also, yellowing of the film was observed when it was subjected to the i-line light. Thus, this film of the Comparative Example cannot be used as a pellicle film in certain applications.

EXAMPLE 2

The same polytrimethylvinylsilane as used in Example 1 was dissolved in toluene to make a 25% solution. This solution was cast over a smooth glass plate by means of a knife coater of 1-mm clearance, dried at 40° C. for 24 hours, at 70° C. for four hours, and at 100° C. for two hours. The film together with the glass plate was submerged in water so as to allow the film body to naturally release itself from the glass plate, and a film having a thickness of 249 μm was obtained.

Next, the film body was adhered to an end face of an aluminum frame with the same epoxy resin adhesive in a manner such that the film is well flattened on the frame. The portion of the film that extends beyond the external edge of the aluminum frame was cut off, and as a result, a pellicle for lithography was prepared (Example 2). The light transmittance of this film was examined, and it was found that more than 90% of the light of wave lengths between 240 and 500 nm was transmitted through the film. When the both faces of the film were coated with an antireflection layer, 98.3% of 436-nm g-line light, 98.0% of 365-nm i-line light, and 96.6% of 249-nm Excimer Laser were transmitted through the film. The mechanical strength of the film was found sufficient, and no yellowing of the film was observed during the examination.

EXAMPLE 3

A pellicle for lithography having a thickness of 1.2 μm was made in the same manner as Example 1 except that in place of the polytrimethylvinylsilane, a polyethyldimethylvinylsilane whose intrinsic viscosity in toluene solution at 20° C. is 0.91 dl/g was used. The light transmittance of this film was examined and it was found that more than 90% of the light of wave lengths from 240 to 500 nm inclusive was transmitted through the film. When the both faces of the film were coated with an antireflection layer, 98.5% of 436-nm g-line light, 98.0% of 365-nm i-line light, and 90.0% of 249-nm Excimer Laser were transmitted through the film. No yellowing of the pellicle film was observed during the examination. Thus, this film makes an effective pellicle film for lithography.

EFFECTS OF THE INVENTION

As described above, the present invention relates to a pellicle for lithography which comprises a film of a high polymer organic silicon compound to be used as a dust-preventing cover. This film can effectively transmit light including ultraviolet light of short wave lengths in the range of from 210 to 500 nm, and does not turn yellow when subjected to lights. That the inventive film makes a very useful pellicle film for covering masks in lithography adapted for manufacture of large-sized integrated circuits, such as, LSI and VLSI based on the exposure method. Furthermore, since the light transmittance of the inventive film is improved, the exposure time can be shortened, and the film thickness can be increased whereby the film strength of the pellicle is increased.

What is claimed is:

1. A pellicle for lithography to be exposed to light of a wavelength of 500 nm or shorter comprising a metal frame and a high polymer organic silicon film adhered to said metal frame, wherein said film has a thickness of from 0.5 μm to 300 μm and passes at least 90% of light having a wavelength of 210 to 500 nm, consisting essentially of a polymer having the formula:

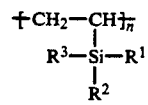

wherein $R^1$, $R^2$, and $R^3$ are the same or different and are alkyl having from 1 to 8 carbon atoms, and n is an integer between 100 and 40,000.

2. The pellicle of claim 1 wherein the film has an antireflection coating layer thereon and passes more than 96 percent of ultraviolet light whose wavelength is 210 nm or greater and wherein the film thickness is not more than 300 μm.

3. The pellicle as claimed in claim 1 wherein the high polymer is formed from polytrimethylvinylsilane, polytriethylvinylsilane, or polyethyldimethylvinylsilane.

4. A method for manufacturing a pellicle for lithography to be exposed to light of a wavelength of 500 nm or shorter comprising the steps of (a) dissolving a high polymer organic silicon compound consisting essentially of formula I

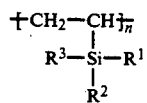
wherein $R^1$, $R^2$, and $R^3$ are the same or different and are alkyl having from 1 to 8 carbon atoms, and n is an integer between 100 and 40,000; in an organic solvent to prepare a solution;
(b) coating a smooth plate with said solution to thereby form a film of a thickness of 0.5 to 300 μm which passes at least 90% of light having a wavelength of 210 to 500 nm; and
(c) adhering said film onto a metal frame.
* * * * *